(12) United States Patent
Tsunomura et al.

(10) Patent No.: US 6,713,805 B2
(45) Date of Patent: Mar. 30, 2004

(54) SEMICONDUCTOR MEMORY DEVICE WITH INCREASED CAPACITANCE

(75) Inventors: Takaaki Tsunomura, Hyogo (JP); Yoshinori Tanaka, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/146,020

(22) Filed: May 16, 2002

(65) Prior Publication Data

US 2003/0089925 A1 May 15, 2003

(30) Foreign Application Priority Data

Nov. 15, 2001 (JP) ........................................ 2001-349684

(51) Int. Cl.[7] ............................................. H01L 27/108
(52) U.S. Cl. ........................ 257/304; 257/303; 257/309; 257/532
(58) Field of Search ................................. 257/303, 304, 257/309, 532

(56) References Cited

U.S. PATENT DOCUMENTS

| | | | | |
|---|---|---|---|---|
| 5,012,309 A | * | 4/1991 | Nakayama | 257/204 |
| 5,077,688 A | * | 12/1991 | Kumanoya et al. | 365/149 |
| 5,138,412 A | * | 8/1992 | Hieda et al. | 257/296 |
| 5,298,775 A | * | 3/1994 | Ohya | 257/211 |
| 5,324,975 A | * | 6/1994 | Kumagai et al. | 257/382 |
| 5,358,888 A | * | 10/1994 | Ahn et al. | 438/396 |
| 5,604,696 A | | 2/1997 | Takaishi | |
| 5,691,551 A | * | 11/1997 | Eimori | 257/303 |
| 5,851,875 A | * | 12/1998 | Ping | 438/253 |
| 6,153,899 A | * | 11/2000 | Ping | 257/296 |
| 6,181,014 B1 | * | 1/2001 | Park et al. | 257/776 |
| 6,194,758 B1 | | 2/2001 | Tanaka et al. | |
| 6,258,691 B1 | * | 7/2001 | Kim | 438/398 |
| 6,518,611 B1 | * | 2/2003 | Ping | 257/296 |

\* cited by examiner

Primary Examiner—David Nelms
Assistant Examiner—Andy Huynh
(74) Attorney, Agent, or Firm—McDermott, Will & Emery

(57) ABSTRACT

A plurality of capacitors of which the sidewalls, that are storage nodes, extend in the vertical direction are aligned in the horizontal direction. Storage node has a rectangular form made of longer sides and shorter sides in the plan view. A long side of storage node extends, in the plan view, in the direction in which a line extends connecting a first storage node contact and a second storage node contact that is positioned diagonally adjacent to first storage node contact. According to the invention, the capacitance of a memory capacitor is increased.

10 Claims, 9 Drawing Sheets

SEMICONDUCTOR MEMORY DEVICE WITH INCREASED CAPACITANCE

BACKGROUND OF THE INVENTION

1. Field of the Invention

The present invention relates, in general, to the semiconductor device, in particular, to a semiconductor device that is improved so that the capacitance is increased while the area is reduced in size in a semiconductor device wherein a plurality of capacitors of which the sidewalls extend in the vertical direction to form storage nodes are aligned in the horizontal direction.

2. Description of the Background Art

It is necessary to fabricate a memory cell capacitor of which the capacitance is increased in as small an area as possible in order to increase the integration of a memory and mixed memory mounting device.

FIG. 17 is a plan view of a memory capacitor according to a prior art and FIG. 18 is a cross sectional view thereof.

Referring to these figures, an STI (shallow trench isolation) 7 is provided in the surface of a silicon substrate 8. Word lines 6 are provided on silicon substrate unit. Bit lines 4 are connected to the sources/drains of the transistors via polypads 5 and bit line contacts 4'. In addition, a capacitor 2 is connected to a transistor via a storage node contact 1 and a polypad 5. Capacitor 2 includes a storage node electrode 2a, a capacitor insulating film 2b and a cell plate electrode 2c. Aluminum wires 3 are provided above capacitor 2.

The plan view of the form of storage node 2a in a conventional capacitor is shown in FIG. 19. Storage node 2a is a rectangular in the plan view. The length of the longer sides of storage node 2a in the plan view is, for example, 0.42 μm and the length of the shorter sides is 0.16 μm.

Referring to FIG. 17, conventional storage nodes 2a are shown in the plan view, wherein the capacitors are arranged so as to extend in the direction in which a line extends connecting a storage node contact 1 with another storage node contact that is located adjacent to the storage node contact 1.

Referring to FIG. 17, the capacitors are arranged so that the longer sides of the storage nodes extend in the direction in which a line extends connecting a storage node contact (SC) with another storage node contact that is located adjacent to the storage node contact in the plan view in the conventional semiconductor memory device and, therefore, the size of rectangular type capacitor 2 can not be expanded any further while maintaining the capacitor structure, maintaining the arrangement of the capacitors and maintaining the arrangement of the storage node contacts according to the prior art as they are.

It is desirable, however, that the arrangement of storage node contacts 1 not be changed in order to optimize the arrangement of bit lines 4 and word lines 6 and, therefore, it is necessary to obtain the structure and the arrangement of new capacitors that allow the sizes of the longer sides and the shorter sides of the storage nodes to expand, that is to say, allow the capacitance of the capacitors to increase, without changing the arrangement of storage node contacts 1.

SUMMARY OF THE INVENTION

This invention is provided in order to solve the above described problem and an object thereof is to provide a semiconductor device that is improved so that a larger capacitance can be gained.

Another object of this invention is to provide a semiconductor device that is improved so that the total length of the longer side and the shorter side can be increased in the plan view of the storage node.

A semiconductor device according to the first aspect of this invention relates to a semiconductor device wherein a plurality of capacitors, of which the sidewalls of the storage nodes extend in the vertical direction, is aligned in the horizontal direction. The above described storage nodes are in a rectangular form consisting of longer sides and shorter sides in the plan view. The above described longer sides of the above storage nodes extend in the direction in which a line extends connecting the first storage node contact with the second storage node contact that is located diagonally adjacent to this first storage node contact in the plan view.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, the embodiments of this invention are described in reference to the drawings.

First Embodiment

Figure 1:
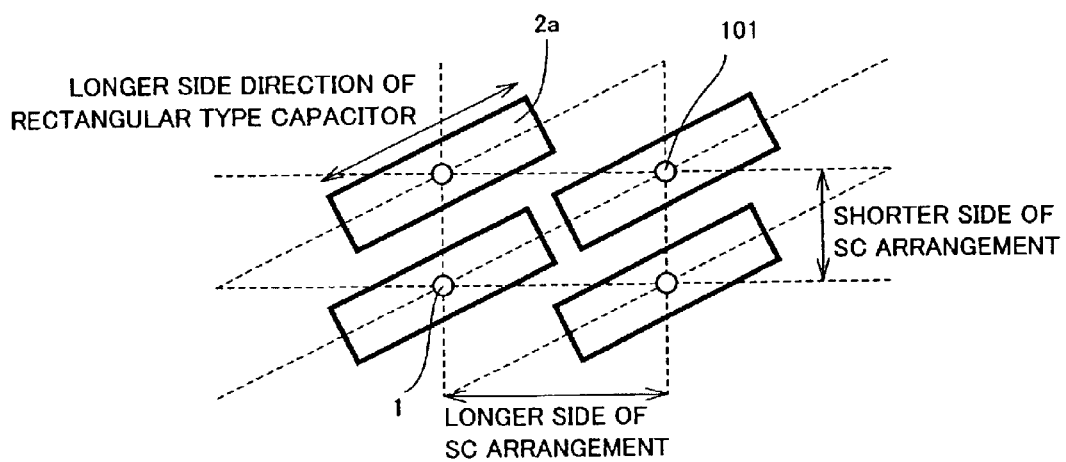
FIG. 1 is a plan view of a semiconductor device according to a first embodiment.
Figure 2:
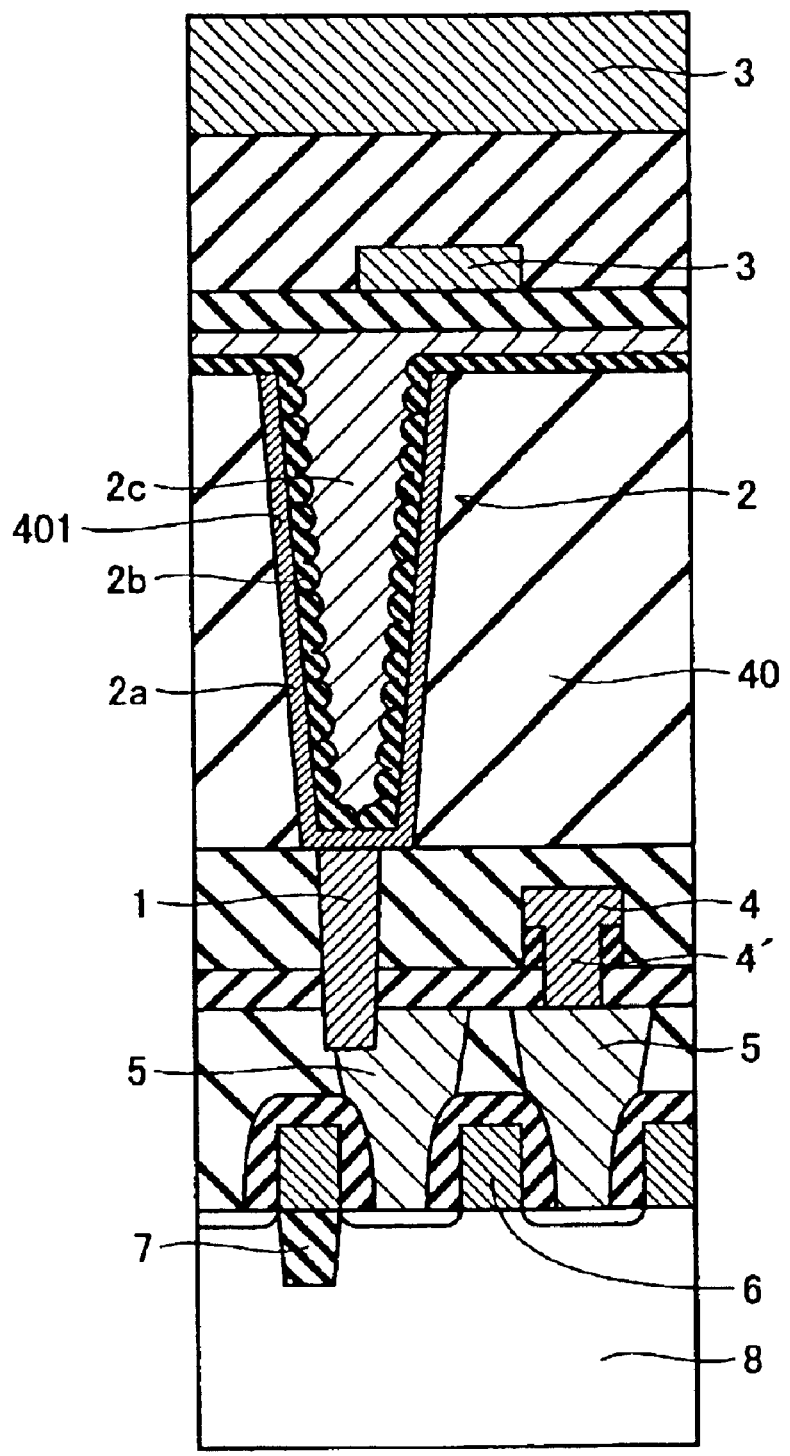
FIG. 2 is a cross sectional view of the semiconductor device according to the first embodiment.

FIG. 1 is a plan view of a semiconductor device according to a first embodiment and FIG. 2 is a cross sectional view thereof.

Figure 17:
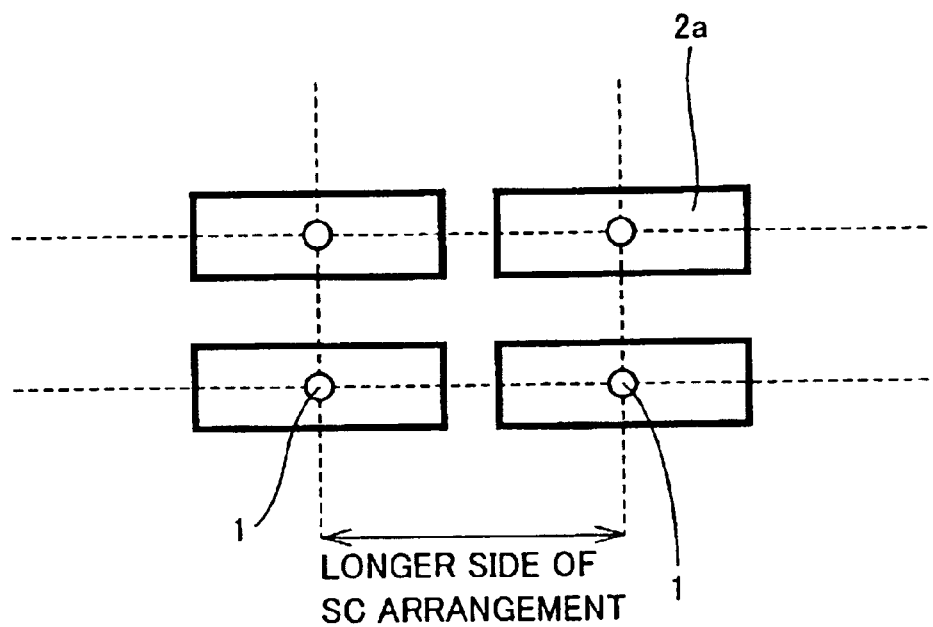
FIG. 17 is a plan view showing the arrangement of storage nodes in a semiconductor device according to a prior art.
Figure 18:
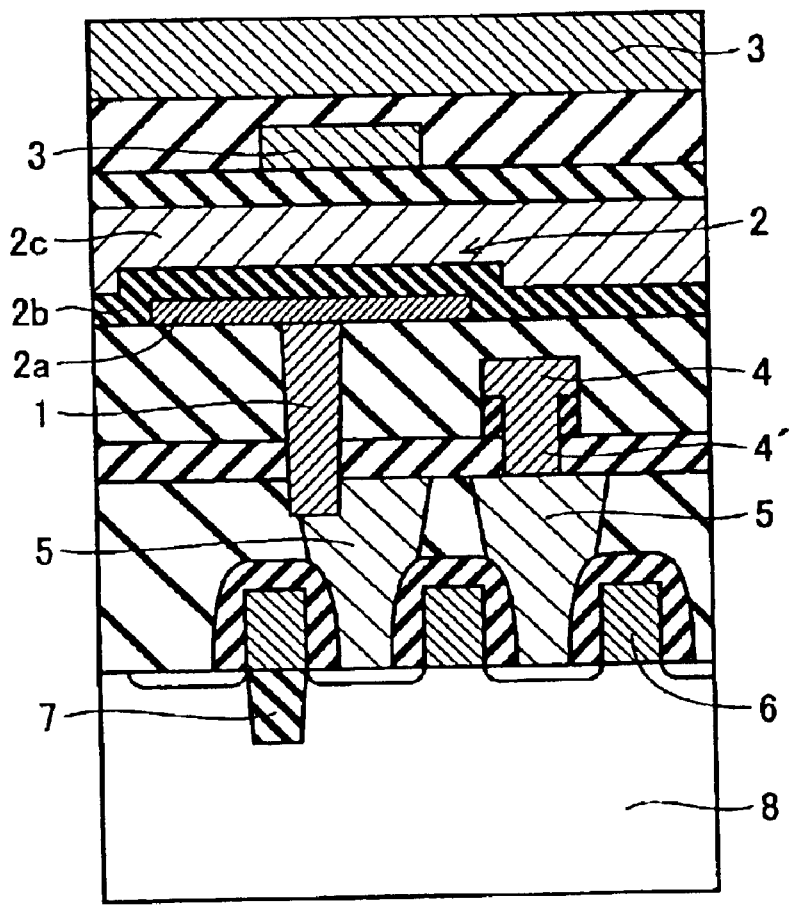
FIG. 18 is a cross sectional view of the semiconductor device according to the prior art.
Figure 19:
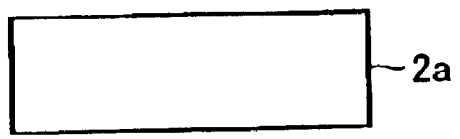
FIG. 19 is a plan view of a storage node used in the semiconductor device according to the prior art.

In these figures the same reference numerals are attached to the same, or corresponding, parts in the prior art shown in FIGS. 17 to 19, of which the descriptions are not repeated.

Referring to these figures, in the semiconductor device according to the first embodiment a plurality of capacitors wherein the sidewalls of storage nodes 2a extend in the vertical direction are aligned in the horizontal direction. Storage node 2a is in a rectangular form consisting of longer sides and shorter sides in the plan view. The longer sides of storage node 2a extend in the direction in which a line extends connecting a storage node contact 1 and a storage node contact 101 that is located diagonally adjacent to storage node contact 1. That is to say, storage node 2a is arranged so that the angle formed from a longer side of rectangular type storage node 2a and a longer side of the SC arrangement becomes arctan (length of a short side of the SC arrangement/length of a longer side of the SC arrangement). When storage node 2a is arranged in such a manner, the longer side can be set at 0.48 μm and the shorter side can be set at 0.13 μm.

Referring to FIG. 2, the sidewalls of storage node 2a cover the sidewalls of a hole 401 that is created in an interlayer insulating film 40. A capacitor dielectric film 2b covers the sidewalls of storage node 2a. A cell plate electrode 2c is filled in into hole 401 so as to contact storage node 2a with capacitor dielectric film 2b intervened there between.

According to the present embodiment, the longer sides of the storage nodes are in the direction in which a line extends connecting storage node contacts that are diagonally adjacent to each other and, therefore, the length of the longer sides can be expanded in comparison with the arrangement of the conventional storage nodes shown in FIG. 17. As a result, the capacitance of capacitor 2 can be increased. In addition, since the area of aperture of a capacitor expands, the coverage of the depositions for the lower electrode of the capacitors, for the capacitor insulating film and for the cell plate electrodes is improved. In addition, the gaps between the capacitors are bent instead of extending in a straight form unlike in the conventional case and, therefore, it becomes easier to carry out the exposure at the time of fabrication of the capacitors.

Second Embodiment

The present embodiment is the same as the first embodiment except for the following points and, therefore, the same numerals are attached to the same, or corresponding, parts, of which the descriptions are not repeated.

Figure 3:
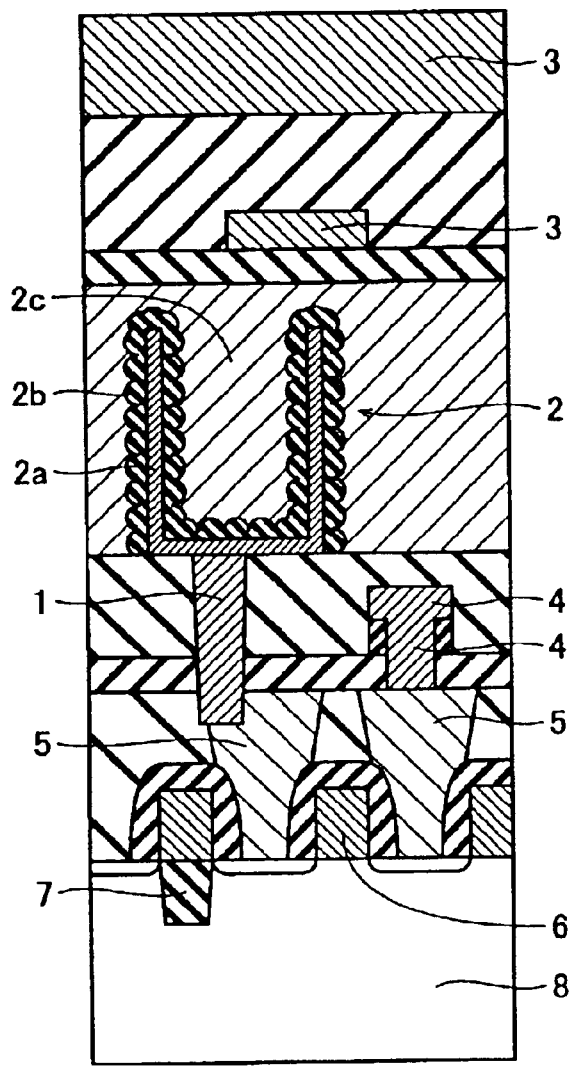
FIG. 3 is a cross sectional view of a semiconductor device according to a second embodiment.

Referring to FIG. 3, sidewalls 2a of the storage nodes make up a cylinder standing in the vertical direction, wherein a capacitor dielectric film 2b covers the inside wall surface and the outside wall surface of the cylinder. A cell plate electrode 2c is provided so as to contact sidewall 2a of the storage node with a capacitor dielectric film 2b intervened there between.

The arrangement of the storage nodes as shown in FIG. 1 can be carried out with respect to a capacitor that has such a structure so that the surface area of the capacitor electrodes can be increased.

Third Embodiment

Figure 4:
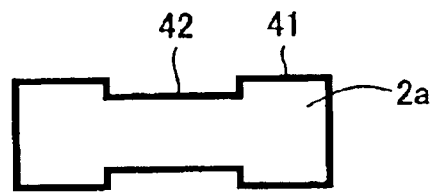
FIG. 4 is a plan view of a storage node used in a semiconductor device according to a third embodiment.
Figure 5:
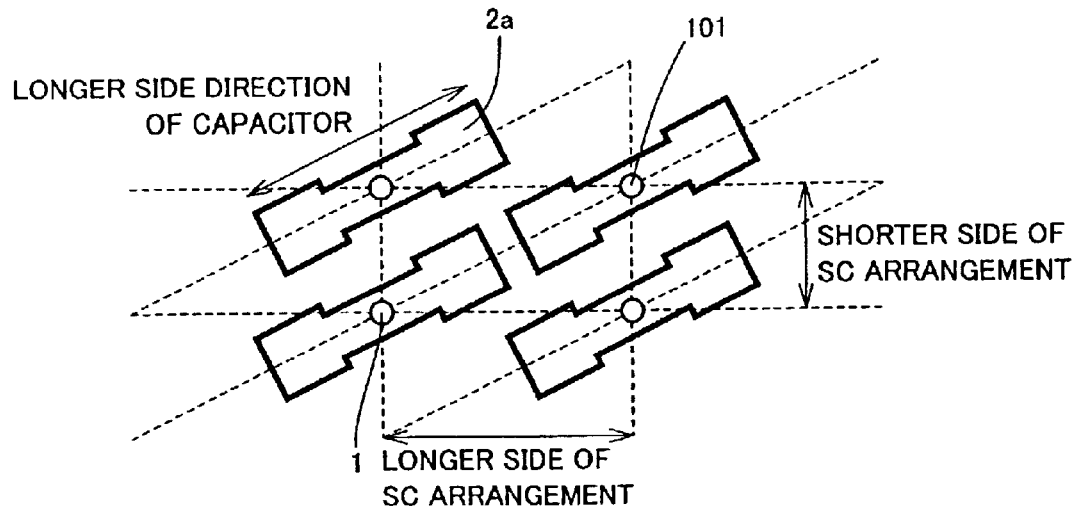
FIG. 5 is a plan view showing the arrangement of the storage nodes in the semiconductor device according to the third embodiment.

FIG. 4 is a plan view of a storage node used in a semiconductor device according to a third embodiment. The storage node shown in FIG. 4 is arranged in the plan view as shown in FIG. 5 in the same manner as in the first embodiment.

According to the present embodiment, recesses 42 are provided in the center portions of the two longer sides of storage node 2a in the plan view so that protruding portions 41 that protrude from the four edge portions in the horizontal direction can be formed. The storage nodes that have such a plan view are arranged as shown in the figure in the direction in which a line extends connecting a storage node contact 1 and a storage node contact 101 that is located diagonally adjacent to storage node contact 1. The cross sectional view of the semiconductor device according to this embodiment is similar to that as shown in FIG. 2 and FIG. 3.

The following effects are gained by using the storage nodes that have the plan view as shown in FIG. 4 and of which the supports are stable. That is to say, referring to FIGS. 2 and 3, it is difficult to knock down the capacitors at the time when the capacitors, wherein the sidewalls of storage nodes 2a extend in the vertical direction, are fabricated. In addition, since the dimensions of the longer sides can be expanded, the capacitance of the capacitors can be increased.

Fourth Embodiment

Figure 6:
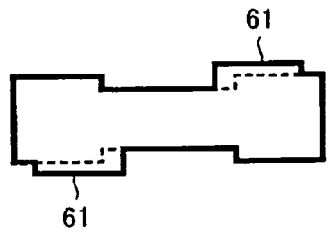
FIG. 6 is a plan view of a storage node used in a semiconductor device according to a fourth embodiment.

FIG. 6 is a plan view of a storage node of a capacitor used in a semiconductor device according to a fourth embodiment. Protruding portions 61 that are diagonally opposite to each other from among the four protruding portions in the plan view of a storage node 2a have further thickness in the horizontal direction.

Figure 7:
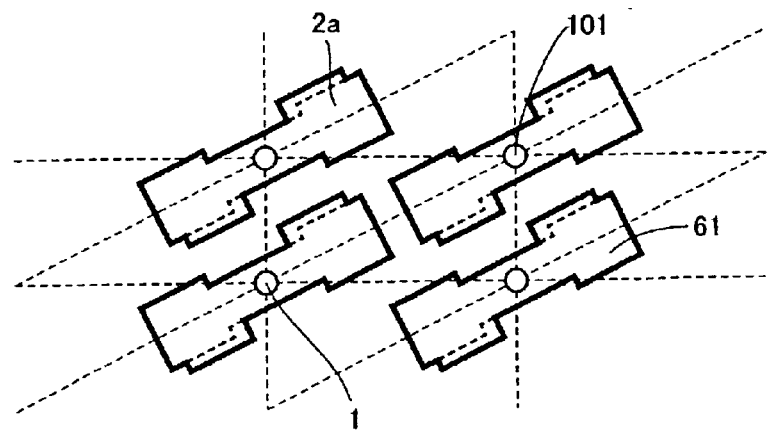
FIG. 7 is a plan view of a semiconductor device wherein a plurality of capacitors is aligned in the horizontal direction according to the fourth embodiment.

FIG. 7 is a plan view of a plurality of the storage nodes shown in FIG. 6 aligned in the horizontal direction in the same manner as in the first embodiment.

The longer sides of storage nodes 2a extend in the direction in which a line extends connecting a storage node contact 1 and a storage node contact 101 that is located diagonally adjacent to storage node contact 1 in the plan view.

According to the present embodiment, a thick portion 61 of a storage node and a narrow portion of the adjacent storage node have become adjacent to each other. Accordingly, an extra margin occurs between adjacent capacitors. In addition, since the protruding portions 61 that are diagonally opposite to each other from among the four protruding portions in the plan view of storage node 2a have further thickness in the horizontal direction, the dimensions of the longer sides of storage node 2a in the plan view can be increased so that the capacitance of the capacitor can further be increased. In addition, storage node 2a is formed so as to have such a plan view and, thereby, the supports are stabilized so that it can be made more difficult to knock down a capacitor 2 at the time when capacitor 2 is fabricated.

Fifth Embodiment

Figure 8:
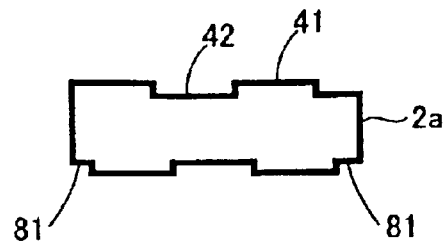
FIG. 8 is a plan view of a storage node of a semiconductor device according to a fifth embodiment.

FIG. 8 is a plan view of a storage node portion of a semiconductor device according to a fifth embodiment. Referring to FIG. 8, recesses 42 are provided in the center portions of the two longer sides of a storage node 2a in the plan view so that protruding portions 41 can protrude in the horizontal direction from the four edge portions of the storage node. Bends 81 are provided at the end parts of the two edge portions of storage node 2a in the plan view.

Figure 9:
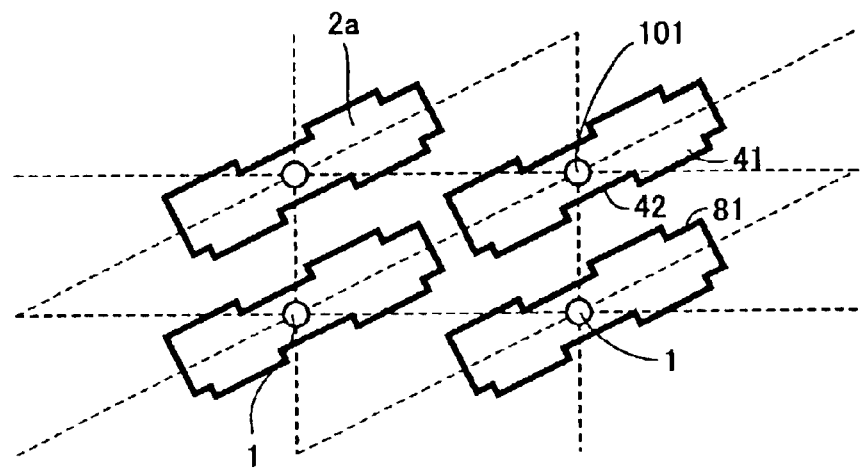
FIG. 9 is a plan view of the semiconductor device wherein a plurality of the storage nodes is aligned in the horizontal direction according to the fifth embodiment.

The storage nodes that have such a plan view are arranged in the direction in which a line extends connecting a storage node contact 1 with a storage node contact 101 that is located diagonally adjacent to storage node contact 1 as shown in FIG. 9.

According to the present embodiment, a thick portion 41 of a storage node and narrow portions 42 and 81 of the adjacent storage node have become opposite to each other so that the margin between the adjacent capacitors can be secured more effectively in comparison with the third embodiment. Furthermore, since the dimensions of the longer sides are further increased, the cross sectional area of a capacitor can further be increased so that the capacitance can be increased in comparison with the third embodiment.

Sixth Embodiment

Figure 10:
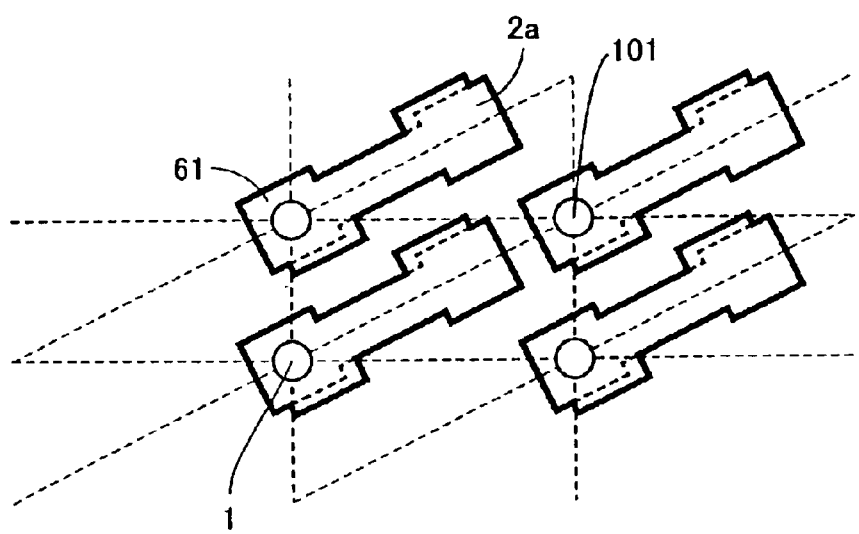
FIG. 10 is a plan view of a semiconductor device according to a sixth embodiment.

FIG. 10 is a plan view of a storage node portion of a semiconductor device according to a sixth embodiment. Here, the storage nodes shown in FIG. 6 are used. In addition, here, the connection position of storage node 2a and storage node contact 1 is located in a thick portion 61 instead of at the center of storage node 2a. By locating the connection between storage node contact 1 and storage node 2a in thick portion 61 of storage node 2a, it becomes easy to overlap the position of storage node contact 1 and the position of storage node 2a. As a result, the yield of the capacitors at the time of fabrication can be increased.

In addition, since the diameter of storage node contact 1 can be increased, the resistance of storage node contact 1 can be lowered.

Seventh Embodiment

Figure 11:
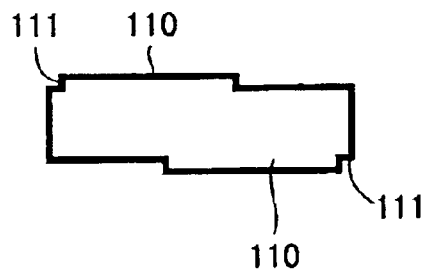
FIG. 11 is a plan view of a storage node used in a semiconductor device according to a seventh embodiment.

FIG. 11 is a plan view of a storage node used in a semiconductor device according to a seventh embodiment. Protruding portions 110 are respectively provided to the portions, which are diagonally opposite to each other, of the two longer sides of a storage node 2a in the plan view. Each of the protruding portions 110 is provided with a bend 111.

Figure 12:
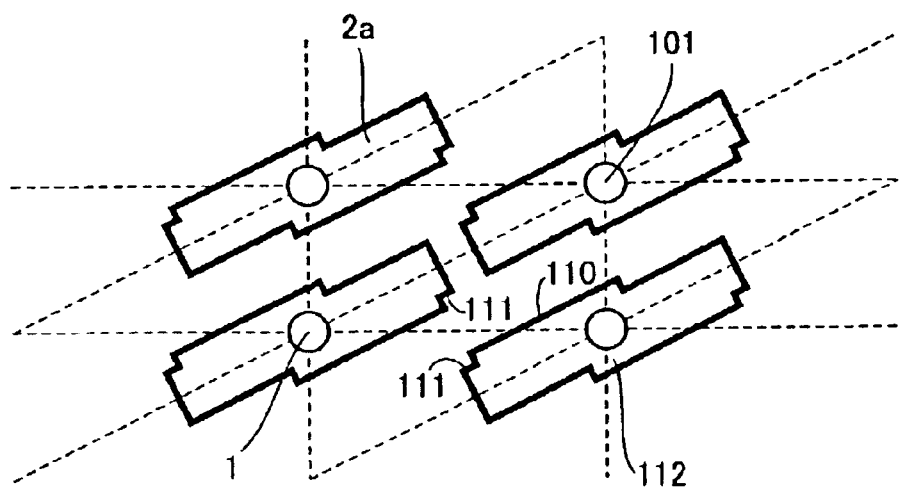
FIG. 12 is a plan view of the semiconductor device wherein a plurality of the storage nodes shown in FIG. 11 is aligned in the horizontal direction.

FIG. 12 is a plan view of a semiconductor device that is arranged so that a plurality of the storage nodes shown in FIG. 11 is aligned in the horizontal direction. The manner of arrangement is the same as in the first and second embodiments.

By respectively providing protruding portions 110 and bends 111 in the portions, which are diagonally opposite to each other, of the two longer sides of a storage node 2a in the plan view, the lengths of the longer sides and shorter sides are increased so that the capacitance of the capacitor can be increased. In addition, by having such a plan view, it is made difficult for capacitor 2 to be knocked down at the time of fabrication. Furthermore, a thick portion of a storage node and a narrow portion of the adjacent storage node have become opposite to each other. In addition, a bend 111 has become opposite to the adjacent bend 111. Accordingly, the margin between the adjacent capacitors can be secured more effectively in comparison with the third embodiment.

In addition, referring to FIG. 12, the connection between a capacitor 2 and a storage node contact 1 can be made through a thick portion 112 and, therefore, the diameter of storage node contact 1 can be increased. Therefore, the positioning of storage node 2a and storage node contact 1 becomes easy at the time of fabrication of capacitor 2 and the resistance of the storage node contact can be lowered. In addition, the aperture radius becomes larger at the center positions of the capacitors and, therefore, the effects are gained that the coverage of the depositions for the lower electrodes, the insulating film and the upper electrodes of the capacitors is improved.

Eighth Embodiment

Figure 13:
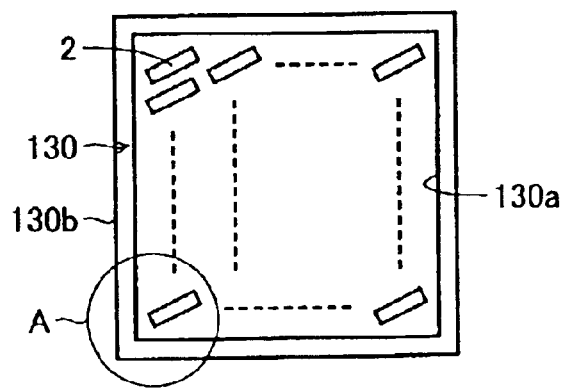
FIG. 13 is a plan view of a semiconductor device according to an eighth embodiment.

When a capacitor has the cross sectional structure as shown in FIGS. 2 and 3 and when the storage nodes are diagonally arranged in the plan view as shown in FIG. 1, the peripheral portion of the memory cells becomes as shown in FIG. 13.

Referring to FIG. 13, a wet etching protection fence 130 is provided so as to surround a plurality of capacitors 2. Wet etching protection fence 130 is made of an inner wall 130a and an outer wall 130b that surrounds inner wall 130a which extend in the vertical direction and which are formed of the same material as storage nodes 2a in order to prevent wet etching from spreading to the outside. These walls 130a and 130b are continuous so as to surround the peripheral portion of the memory cells in order to prevent wet etching at the time of fabrication of the capacitors from reaching the outside of the memory cells.

Figure 14:
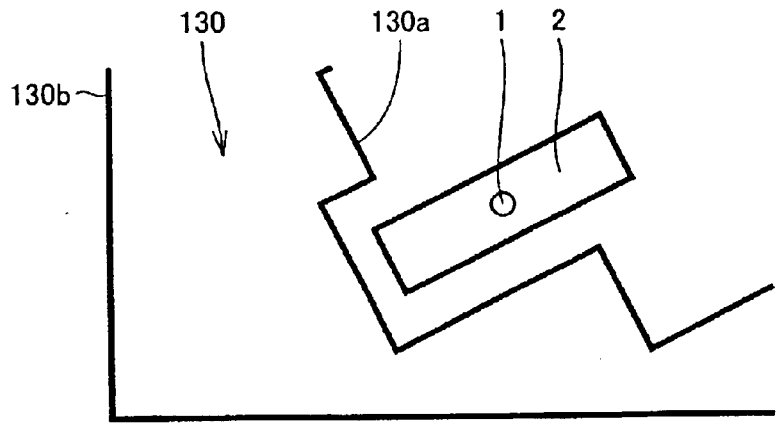
FIG. 14 is an enlarged view of a portion A in FIG. 13.
Figure 15:
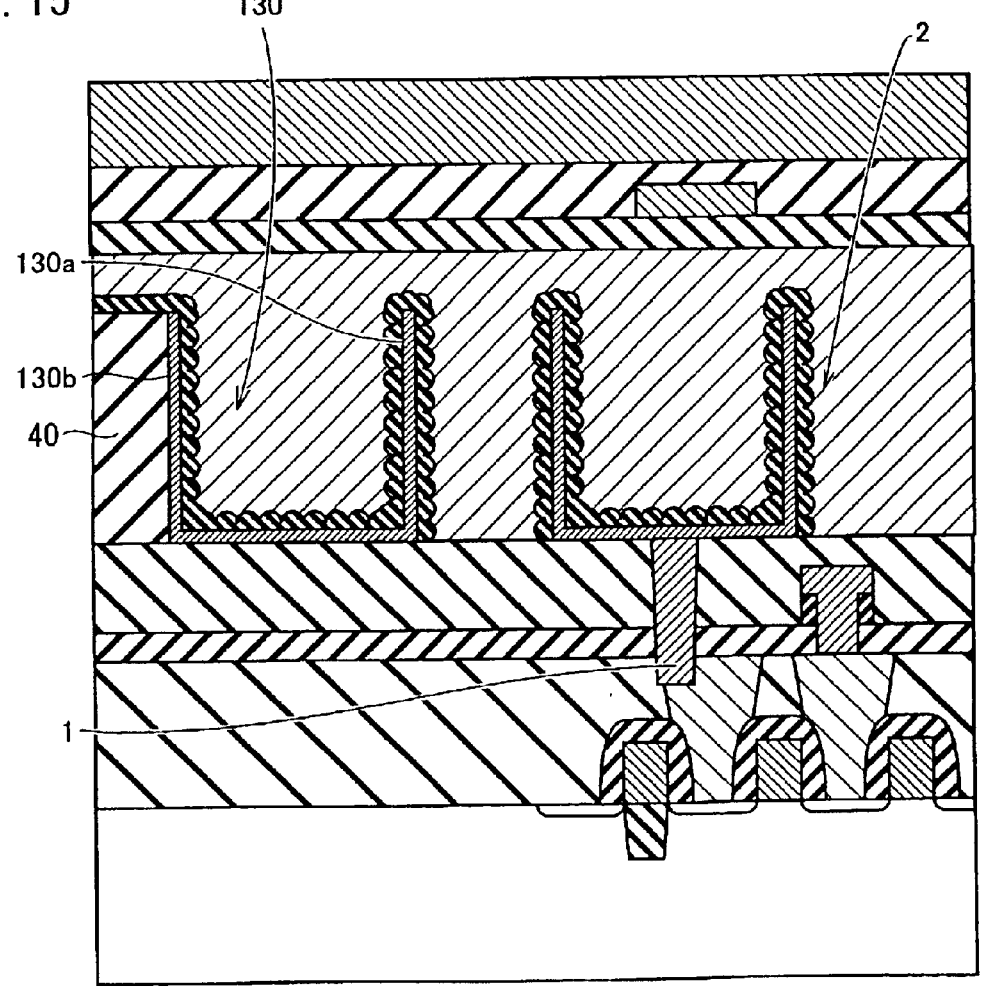
FIG. 15 is a cross sectional view in the portion A of FIG. 13.

FIG. 14 is an enlarged view of the portion A in FIG. 14. FIG. 15 is a cross sectional view of the portion A in FIG. 13.

In the present embodiment, inner wall 130a is bent in two or more portions in the plan view. Since the inner wall is bent in such a manner in the plan view, the supports are stable so that it can be made difficult to knock down this wall at the time when the inside wall in the peripheral portion of the memory cells is fabricated. Thereby, the yield at the time of fabrication of the memory cells can be increased.

Ninth Embodiment

Figure 16:
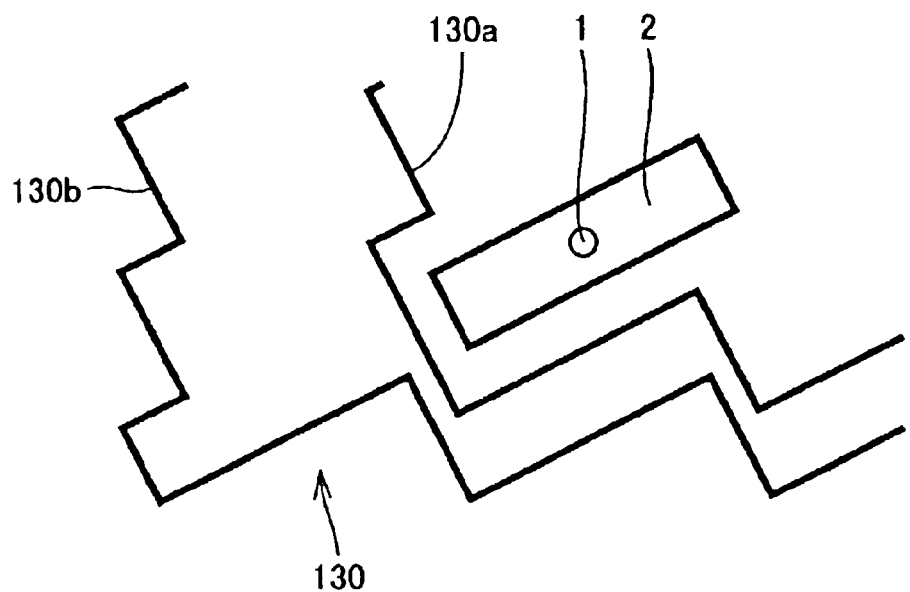
FIG. 16 is a plan view of a memory peripheral portion of a semiconductor device according to a ninth embodiment.

FIG. 16 is a plan view of the peripheral portion of the memory cells of a semiconductor device according to a ninth embodiment. Differing from the eighth embodiment, a wall 130b outside of a wet etching protection fence 130 is bent in two, or more, places.

Since the structure of the peripheral portion of the memory cells is created in such a manner, it not only becomes difficult to knock down the inner wall of the peripheral portion of the memory cells but also it can be made difficult to knock down outer wall 130b of the peripheral portion of the memory cells. Accordingly, the yield at the time of fabrication of the memory cells can be further increased.

The embodiments disclosed herein should be considered to be illustrative from all viewpoints and are not Imitative. The scope of the present invention is defined not by the above description but, rather, by the claims and is intended to include the meanings equivalent to the claims and all the modifications within the scope.

As described above, according to this invention the total sum of the length of a longer side and the length of a shorter side of a storage node in the plan view can be increased and, therefore, the capacitance of a capacitor can be increased.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising a plurality of capacitors, each capacitor comprising a storage node in contact with an underlying storage node contact, wherein:

the storage nodes are arranged in adjacent columns and rows;

sidewalls of storage nodes extend in the vertical direction are aligned in the horizontal direction;

said storage node has a rectangular form comprising longer sides and shorter sides in the plan view; and said longer sides of said storage node extend, in the plan view, in the direction in which a line extends connecting one storage node contact with the diagonally closest storage node contact to said one storage node contact.

2. The semiconductor device according to claim 1, wherein the sidewall of said storage node is provided so as to cover a sidewall of a hole that is created in an interlayer insulating film.

3. The semiconductor device according to claim 1, wherein the sidewall of said storage node is a cylinder that is stood up in the vertical direction and wherein a capacitor dielectric film covers an inner wall surface and an outer wall surface of the cylinder.

4. The semiconductor device according to claim 1, wherein recesses are provided in center portions of the two longer sides of said storage node in the plan view so that protruding portions can protrude in the horizontal direction from the four edge portions of the storage node.

5. A semiconductor device wherein a plurality of capacitors where sidewalls of storage nodes extend in the vertical direction are aligned in the horizontal direction, wherein said storage node has a rectangular form comprising longer sides and shorter sides in the plan view, wherein said longer sides of said storage node extend, in the plan view, in the direction in which a line extends connecting a first storage node contact with a second storage node contact that is located diagonally adjacent to the first storage node contact, wherein recesses are provided in center portions of the two longer sides of said storage node in the plan view so that protruding portions can protrude in the horizontal direction from the four edge portions of the storage node, and wherein portions diagonally opposite to each other from among said four protruding portions of said storage node in the plan view have further thickness in the horizontal direction.

6. A semiconductor device wherein a plurality of capacitors where sidewalls of storage nodes extend in the vertical direction are aligned in the horizontal direction, wherein said storage node has a rectangular form comprising longer sides and shorter sides in the plan view, wherein said longer sides of said storage node extend, in the plan view, in the direction in which a line extends connecting a first storage node contact with a second storage node contact that is located diagonally adjacent to the first storage node contact, wherein recesses are provided in center portions of the two longer sides of said storage node in the plan view so that protruding portions can protrude in the horizontal direction from the four edge portions of the storage node, and wherein bends are provided at the end parts of said two edge portions of said storage node in the plan view.

7. A semiconductor device wherein a plurality of capacitors where sidewalls of storage nodes extend in the vertical direction are aligned in the horizontal direction, wherein said storage node has a rectangular form comprising longer sides and shorter sides in the plan view, wherein said longer sides of said storage node extend, in the plan view, in the direction in which a line extends connecting a first storage node contact with a second storage node contact that is located diagonally adjacent to the first storage node contact, wherein recesses are provided in center portions of the two longer sides of said storage node in the plan view so that protruding portions can protrude in the horizontal direction from the four edge portions of the storage node, and wherein said first and second storage node contacts respectively contact thick portions that protrude in said horizontal direction from said storage nodes.

8. A semiconductor device wherein a plurality of capacitors where sidewalls of storage nodes extend in the vertical direction are aligned in the horizontal direction, wherein said storage node has a rectangle form comprising longer sides and shorter sides in the plan view, wherein said longer sides of said storage node extends, in the plan view, in the direction in which a line extends connecting a first storage node contact with a second storage node contact that is located diagonally adjacent to the first storage node contact, and wherein protruding portions are respectively provided in the portions, which are diagonally opposite to each other, of the two longer sides of said storage node in the plan view and a bend is provided in each of the protruding portions.

9. A semiconductor device wherein a plurality of capacitors where sidewalls of storage nodes extend in the vertical direction are aligned in the horizontal direction, wherein said storage node has a rectangle form comprising longer sides and shorter sides in the plan view, and wherein said longer sides of said storage node extends, in the plan view, in the direction in which a line extends connecting a first storage node contact with a second storage node contact that is located diagonally adjacent to the first storage node contact, the semiconductor device further comprising a wet etching protection fence made of an inner wall and an outer wall that surrounds the inner wall for preventing wet etching from spreading to the outside, which surround a plurality of said capacitors, extend in the vertical direction and are formed of the same material has said storage node, wherein said inner wall is bent in two, or more, places in the plan view.

10. The semiconductor device according to claim 9, wherein said outer wall is bent in two, or more, places in the plan view.

* * * * *